US012631684B2

(12) United States Patent
Kim

(10) Patent No.: US 12,631,684 B2
(45) Date of Patent: May 19, 2026

(54) BATTERY DIAGNOSIS DEVICE, BATTERY DIAGNOSIS METHOD, BATTERY PACK AND ELECTRIC VEHICLE

(71) Applicant: LG Energy Solution, Ltd., Seoul (KR)

(72) Inventor: Young-Jin Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 552 days.

(21) Appl. No.: 18/011,746

(22) PCT Filed: Dec. 16, 2021

(86) PCT No.: PCT/KR2021/019238
§ 371 (c)(1),
(2) Date: Dec. 20, 2022

(87) PCT Pub. No.: WO2022/145831
PCT Pub. Date: Jul. 7, 2022

(65) Prior Publication Data
US 2023/0314514 A1     Oct. 5, 2023

(30) Foreign Application Priority Data
Dec. 29, 2020     (KR) ........................ 10-2020-0185703

(51) Int. Cl.
*G01R 31/367*          (2019.01)
*B60L 58/10*           (2019.01)
(Continued)

(52) U.S. Cl.
CPC ............ *G01R 31/367* (2019.01); *B60L 58/10* (2019.02); *G01R 31/3842* (2019.01);
(Continued)

(58) Field of Classification Search
CPC ... G01R 31/367; G01R 31/3842; B60L 58/10; H01M 10/052; H01M 10/448; H01M 10/484; H01M 2220/20
See application file for complete search history.

(56) References Cited

U.S. PATENT DOCUMENTS

2011/0206952 A1     8/2011  Mano et al.
2012/0116701 A1     5/2012  Yuasa
(Continued)

FOREIGN PATENT DOCUMENTS

CN          102768343 A     11/2012
CN          109916987 A      6/2019
(Continued)

OTHER PUBLICATIONS

International Search Report for Application No. PCT/KR2021/019238 mailed Mar. 28, 2022, pp. 1-3.
(Continued)

*Primary Examiner* — Catherine T. Rastovski
*Assistant Examiner* — Sharad Timilsina
(74) *Attorney, Agent, or Firm* — Lerner David LLP

(57) ABSTRACT

A battery diagnosis apparatus includes a voltage sensor to generate a voltage signal indicating a battery voltage of a battery, a current sensor to generate a current signal indicating a battery current of the battery and a control circuit. The control circuit determines a capacity curve indicating a relationship between the battery voltage and a charge capacity in a set voltage range based on the voltage signal and the current signal collected at each unit time for a constant current charging period. The control circuit determines a differential curve indicating a relationship between the battery voltage and a differential capacity in the set voltage range based on the capacity curve. The control circuit determines an approximate straight line of the differential
(Continued)

1 curve using a linear approximation algorithm, and determines whether lithium deposition is present in the battery based on the approximate straight line.

10 Claims, 5 Drawing Sheets

(51) Int. Cl.

| | | |
|---|---|---|
| *G01R 31/3842* | (2019.01) | |
| *H01M 10/052* | (2010.01) | |
| *H01M 10/44* | (2006.01) | |
| *H01M 10/48* | (2006.01) | |

(52) U.S. Cl.
CPC ....... *H01M 10/052* (2013.01); *H01M 10/448* (2013.01); *H01M 10/484* (2013.01); *H01M 2220/20* (2013.01)

(56) References Cited

U.S. PATENT DOCUMENTS

| | | | | |
|---|---|---|---|---|
| 2013/0076363 A1* | 3/2013 | Takahashi | ............ | G01R 31/387 |
| | | | | 324/427 |
| 2013/0335009 A1* | 12/2013 | Katsumata | ......... | G01R 31/3647 |
| | | | | 702/63 |
| 2015/0293182 A1 | 10/2015 | Tajima et al. | | |
| 2017/0212170 A1* | 7/2017 | Torai | ................... | H01M 10/482 |
| 2017/0234930 A1* | 8/2017 | Lee | ................... | G01R 31/3842 |
| | | | | 320/162 |
| 2021/0021000 A1 | 1/2021 | Sada et al. | | |
| 2021/0199723 A1 | 7/2021 | Kim et al. | | |

FOREIGN PATENT DOCUMENTS

| | | | | | | |
|---|---|---|---|---|---|---|
| CN | 110133527 | A | | 8/2019 | | |
| CN | 109663756 | B | | 7/2020 | | |
| EP | 3690462 | A1 | | 8/2020 | | |
| EP | 3835802 | A1 | | 6/2021 | | |
| JP | 4952808 | B2 | | 6/2012 | | |
| JP | 2014002055 | A | | 1/2014 | | |
| JP | 5492291 | B2 | | 5/2014 | | |
| JP | 2016126891 | A | | 7/2016 | | |
| JP | 2017-020916 | A | | 1/2017 | | |
| JP | 2017133870 | A | | 8/2017 | | |
| JP | 2017-161228 | A | | 9/2017 | | |
| JP | 6347212 | B2 | | 6/2018 | | |
| JP | 2020140884 | A | | 9/2020 | | |
| JP | 2021026373 | A | * | 2/2021 | | |
| JP | WO2019171688 | A1 | | 3/2021 | | |
| JP | 7042228 | B2 | * | 3/2022 | ............... | G01L 5/00 |
| KR | 20130142884 | A | | 12/2013 | | |
| KR | 20170023583 | A | | 3/2017 | | |
| KR | 20200122111 | A | | 10/2020 | | |
| KR | 20200123658 | A | | 10/2020 | | |
| WO | 2017098686 | A1 | | 6/2017 | | |

OTHER PUBLICATIONS

Search Report dated Jan. 29, 2026 from the Office Action for Chinese Application No. 202180049510.6 issued Jan. 31, 2026, pp. 1-3.

Rui, X. et al., "Lithium Plating Evaluation Method for Li-ion Batteries Based on Simplified P2D Model" Journal of Mechanical Engineering, Nov. 2025, pp. 176-188, vol. 61, No. 22.

\* cited by examiner

Charge capacity Q[Ah]

BATTERY DIAGNOSIS DEVICE, BATTERY DIAGNOSIS METHOD, BATTERY PACK AND ELECTRIC VEHICLE

CROSS-REFERENCE TO RELATED APPLICATIONS

The present application is a national phase entry under 35 U.S.C. § 371 of International Application No. PCT/KR2021/019238 filed Dec. 16, 2021, which claims priority from Korean Patent Application No. 10-2020-0185703 filed Dec. 29, 2020, all of which are incorporated herein by reference.

TECHNICAL FIELD

The present disclosure relates to technology for detection of lithium deposition in a battery.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium ion batteries and the like, and among them, lithium ion batteries have little of no memory effect, and thus they are gaining more attention than nickel-based batteries for their advantages that recharging can be done whenever it is convenient, the self-discharge rate is very low and the energy density is high.

A lithium ion the battery includes a positive electrode, a negative electrode, an electrolyte and a separator, and is a secondary battery that can be charged/discharged as lithium ions move through the electrolyte between the positive electrode and the negative electrode.

The lithium ion battery slowly degrades in the repeated charge/discharge cycles. In particular, as the negative electrode structure degrades from fresh condition, there is an increasing likelihood of lithium deposition in which some of lithium ions having moved from the positive electrode to the negative electrode through the electrolyte during charging are not intercalated into the negative electrode and are deposited as metal lithium on the negative electrode surface. The lithium deposition is the main cause that degrades the charge/discharge performance and shortens the life of the lithium ion battery, and short circuits occur between the positive electrode and the negative electrode by the metal lithium, resulting in increased fire risks.

SUMMARY

Technical Problem

The inventors recognized that a relationship between the battery voltage and the charge capacity of a battery being charged is definitely changed depending on the presence or absence of lithium deposition.

The present disclosure is directed to providing a battery diagnosis apparatus, a battery diagnosis method, a battery pack and an electric vehicle in which a capacity curve and a differential curve of a battery degraded from fresh condition are obtained in a sequential order through a constant current charging procedure, information associated with lithium deposition is extracted from an approximate straight line of the differential curve, and the presence or absence of lithium deposition in the battery is determined based on the extracted information.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery diagnosis apparatus according to an aspect of the present disclosure includes a voltage sensor configured to measure a battery voltage across a battery and generate a voltage signal indicating the measured battery voltage; a current sensor configured to measure a battery current flowing through the battery and generate a current signal indicating the measured battery current; and a control circuit configured to collect the voltage signal and the current signal at each unit time. The control circuit is configured to determine a capacity curve indicating a relationship between the battery voltage and a charge capacity over a predetermined set voltage range based on the voltage signal and the current signal collected at each unit time for a constant current charging period of the battery over the set voltage range. The charge capacity indicates a cumulative value of the battery current. The control circuit is configured to determine a differential curve indicating a relationship between the battery voltage and a differential capacity over the set voltage range based on the capacity curve. The differential capacity is a ratio between a change in the charge capacity for each unit time and a change in the battery voltage for each unit time. The control circuit is configured to determine a linear approximation of the differential curve using a linear approximation algorithm. The control circuit is configured to determine whether lithium deposition is present in the battery based on the linear approximation.

An upper limit of the set voltage range may be equal to a preset end-of-charge voltage for the battery. A lower limit of the set voltage range may be lower than the upper limit by a reference voltage amount.

The linear approximation algorithm may be a least square method.

The control circuit may be configured to determine that lithium deposition is present in the battery in response to a slope of the linear approximation being larger than a reference slope.

The control circuit may be configured to determine the reference slope based on a cumulative usage capacity of the battery.

The control circuit may be configured to determine that lithium deposition is present in the battery in response to a coefficient of determination of the linear approximation of the differential curve is smaller than a reference coefficient of determination.

The control circuit may be configured to determine the reference coefficient of determination based on a cumulative usage capacity of the battery.

A battery pack according to another aspect of the present disclosure includes the battery diagnosis apparatus according to any of the embodiments described herein.

An electric vehicle according to still another aspect of the present disclosure includes the battery pack.

A battery diagnosis method according to yet another aspect of the present disclosure may include: determining, by a control circuit, a capacity curve indicating a relationship between (i) a battery voltage measured across a battery and (ii) a charge capacity over a predetermined set voltage range based on a voltage signal and a current signal collected at each unit time for a constant current charging period of the battery over the predetermined set voltage range; determining, by the control circuit, a differential curve indicating a relationship between the battery voltage and a differential capacity over the set voltage range based on the capacity curve, wherein the differential capacity is a ratio between a change in the charge capacity for each unit time and a change in the battery voltage for each unit time; determining, by the control circuit, a linear approximation of the differential curve using a linear approximation algorithm; and determining, by the control circuit, whether lithium deposition is present in the battery based on the linear approximation.

Advantageous Effects

According to at least one of the embodiments of the present disclosure, it is possible to determine the presence or absence of lithium deposition in the battery based on information associated with lithium deposition extracted from the approximate straight line of the differential curve after obtaining the capacity curve and the differential curve of a battery degraded from fresh condition in a sequential order through the constant current charging procedure.

According to at least one of the embodiments of the present disclosure, it is possible to determine at least one parameter (a 'reference voltage', a 'reference slope', a 'reference determine coefficient' as described below) used to diagnose lithium deposition in the battery based on the cumulative charge/discharge capacity of the battery.

The effects of the present disclosure are not limited to the above-mentioned effects, and these and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
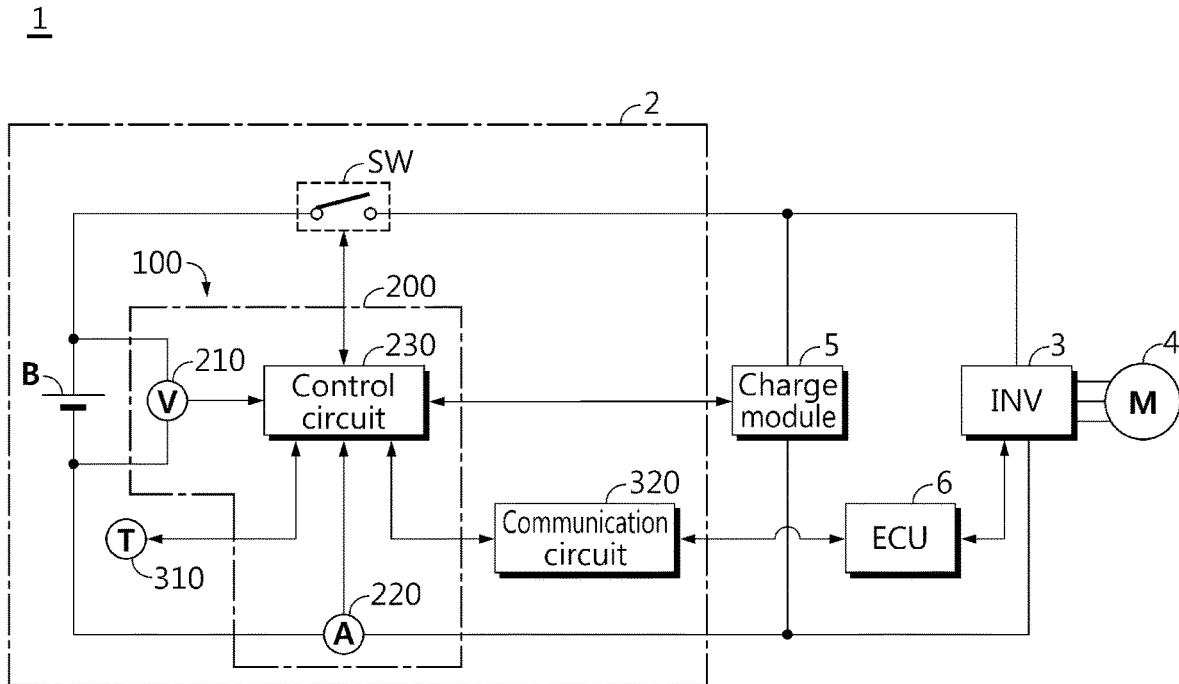
FIG. 1 is an exemplary diagram showing an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware and software either alone or in combination.

In addition, throughout the specification, it will be further understood that when an element is referred to as being "connected to" another element, it can be directly connected to the other element or intervening elements may be present.

FIG. 1 is an exemplary diagram showing an electric vehicle according to the present disclosure.

Referring to FIG. 1, the electric vehicle 1 includes a battery pack 2, an inverter 3, an electric motor 4, a charge module 5 and a vehicle controller 6.

The battery pack 2 includes a battery B, a switch SW and a battery management system 100.

The battery B may be coupled to the inverter 3 and/or the charge module 5 through a pair of power terminals provided in the battery pack 2. The battery B is a rechargeable battery, and may be, for example, a lithium ion battery.

The inverter 3 is provided to convert the direct current (DC) from the battery B to alternating current (AC) in response to a command from the battery management system 100. The electric motor 4 may be, for example, a 3-phase AC motor. The electric motor 4 operates using the AC from the inverter 3.

The switch SW is connected in series to the battery B. The switch SW is installed on a current path for the charge/discharge of the battery B. The on/off control of the switch SW is performed in response to a switching signal from the battery management system 100. The switch SW may be a mechanical relay that is turned on/off by the magnetic force of a coil or a semiconductor switching device such as a Metal Oxide Semiconductor Field Effect transistor (MOSFET).

The charge module 5 is provided to regulate the charge power for the battery B in response to a command from the control circuit 230. When the battery voltage of the battery B is equal to or lower than a lower voltage limit $V_L$ of a set voltage range as described below, the control circuit 230 may command constant current charging to the charge module 5. The charge module 5 may be, in hardware, a DC-DC converter, a constant current circuit or a combination thereof.

The battery management system 100 is provided to take responsibility for overall control related to the charge/discharge of the battery B. The battery management system 100 includes a battery diagnosis apparatus 200. The battery management system 100 may further include at least one of a temperature sensor 310 or a communication circuit 320. Hereinafter, it is assumed that the battery management system 100 includes the battery diagnosis apparatus 200, the temperature sensor 310 and the communication circuit 320.

The battery diagnosis apparatus 200 includes a voltage sensor 210, a current sensor 220 and a control circuit 230.

The voltage sensor 210 is connected in parallel to the battery B, and is configured to detect a battery voltage across the battery B, and generate a voltage signal indicating the detected battery voltage.

The current sensor 220 is connected in series to the battery B through the current path. The current sensor 220 is configured to detect a battery current flowing through the battery B, and generate a current signal indicating the detected battery current.

The temperature sensor 310 is configured to detect a temperature of the battery B, and generate a temperature signal indicating the detected temperature.

The communication circuit 320 may include a communication circuit configured to support wired or wireless communication between the control circuit 230 and the vehicle controller 6 (for example, an Electronic Control Unit (ECU)). The wired communication may be, for example, controller area network (CAN) communication, and the wireless communication may be, for example, Zigbee or Bluetooth communication. The communication protocol is not limited to a particular type and may include any communication protocol for supporting wired/wireless communication between the control circuit 230 and the vehicle controller 6.

The communication circuit 320 may include an output device (for example, a display, a speaker) to provide information received from the vehicle controller 6 and/or the control circuit 230 in a recognizable form. The vehicle controller 6 may control the inverter 3 based on battery information (for example, voltage, current, temperature, state of charge (SOC)) collected via communication with the battery management system 100.

The control circuit 230 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The control circuit 230 may have a memory device. The memory device may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory device may store data and programs required for computation by the control circuit 230. The memory device may store data indicating the result of computation by the control circuit 230.

The control circuit 230 may be operably coupled to the switch SW, the charge module 5, the voltage sensor 210, the current sensor 220, the temperature sensor 310 and/or the communication circuit 320. Operably coupled refers to connected to transmit and receive a signal in one or two directions. The control circuit 230 may periodically or aperiodically collect a sensing signal in a repeated manner. The sensing signal indicates the synchronization-detected voltage signal, current signal and/or temperature signal.

The control circuit 230 may determine a state of charge (SOC) of the battery B based on the sensing signal at a predetermined time interval during the charge/discharge of the battery B. The well-known algorithms such as ampere counting, an SOC-open circuit voltage (OCV) curve and Kalman filter may be used to determine the SOC.

Figure 2:
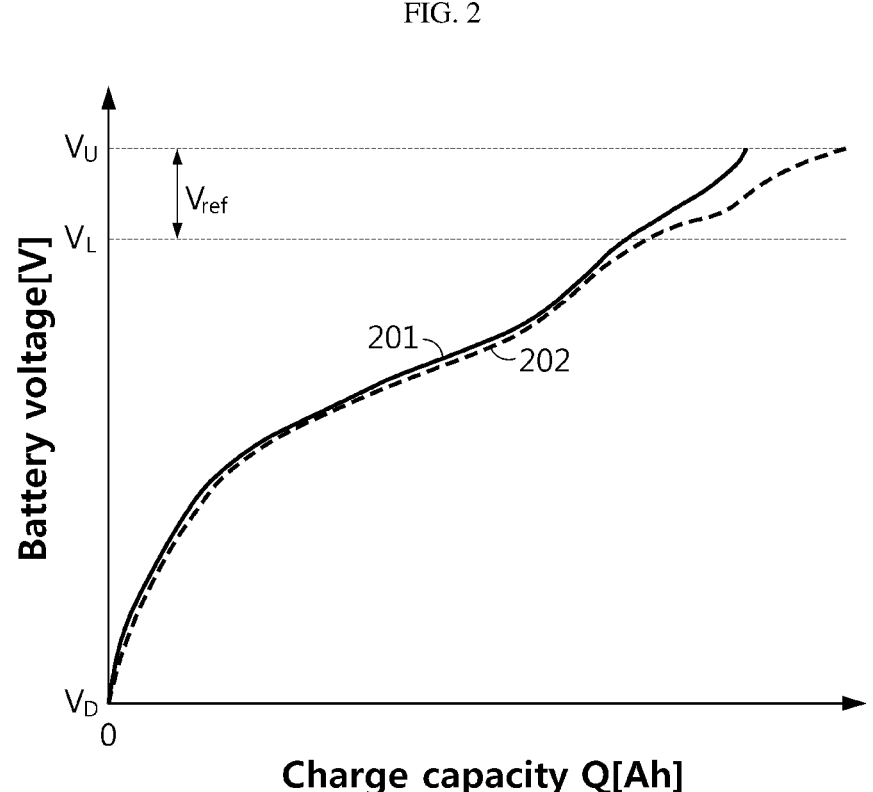
FIG. 2 is an exemplary diagram showing a capacity curve obtained through constant current charging of a battery shown in FIG. 1.
Figure 3:
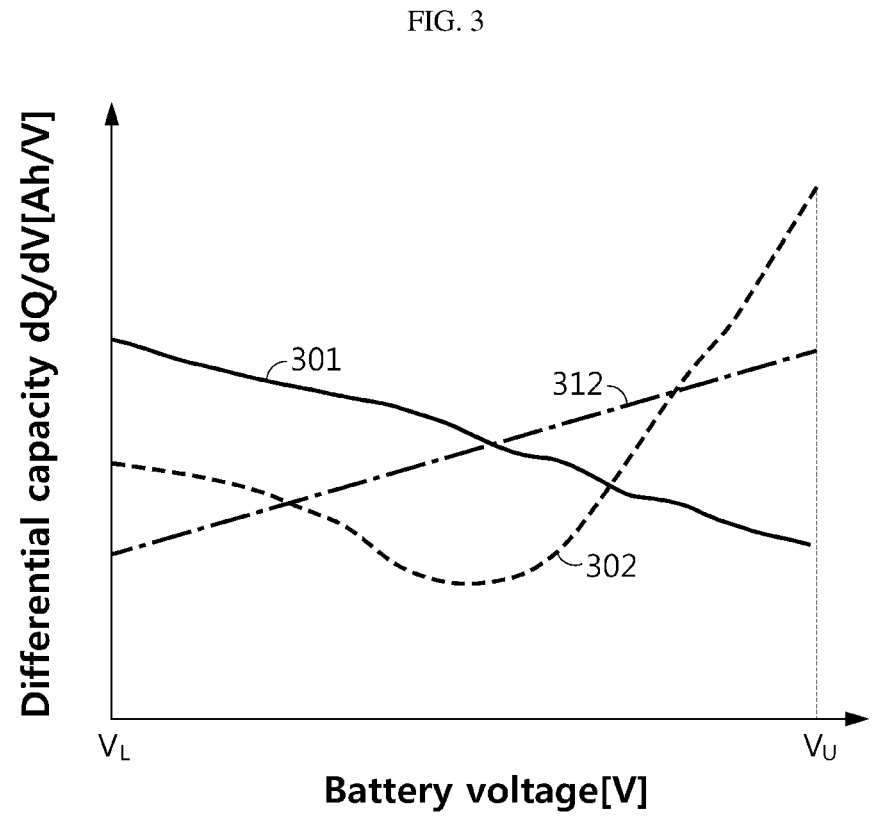
FIG. 3 is an exemplary diagram showing differential curves associated with the capacity curves shown in FIG. 2.

FIG. 2 is an exemplary diagram showing a capacity curve obtained through constant current charging of the battery shown in FIG. 1, and FIG. 3 is an exemplary diagram showing differential curves associated with the capacity curves shown in FIG. 2. Each curve 201, 202, 301, 302 shown in FIGS. 2 and 3 may be treated as a type of signal (time-series).

The two capacity curves of FIG. 2 are obtained through constant current charging of two sample batteries fabricated with the same electrochemical specification as the battery B and having the same State Of Health (SOH). FIG. 2 shows constant current charging of each sample battery over the total voltage range from a predetermined end-of-discharge voltage $V_D$ to a predetermined end-of-charge voltage $V_C$. The end-of-charge voltage $V_C$ may be given as the maximum voltage to which the charge of the battery B is allowed, and the end-of-discharge voltage $V_D$ may be given as the minimum voltage to which the discharge of the battery B is allowed.

Referring to FIG. 2, the capacity curve 201 indicates a relationship between the battery voltage and the charge capacity over the total voltage range, obtained through constant current charging of the sample battery free of lithium deposition. The capacity curve 202 indicates a relationship between the battery voltage and the charge capacity over the total voltage range, obtained through constant current charging of the sample battery in which lithium deposition is present.

The charge capacity as used herein is the result of accumulating the battery current measured by the current sensor 220 at each unit time from a particular time during charging, i.e., the cumulative value of the battery current. Accordingly, the charge capacity keeps increasing during charging.

Referring to FIG. 3, the differential curve 301 is a dataset that may be obtained from the capacity curve 201 of FIG. 2, and indicates a relationship between (i) the battery voltage V and (ii) the differential capacity dQ/dV of the capacity curve 201 in the set voltage range $V_L\sim V_U$. The differential curve 302 is a dataset that may be obtained from the capacity curve 202 of FIG. 2, and indicates a relationship between (i) the battery voltage and (ii) the differential capacity of the capacity curve 202 in the set voltage range $V_L\sim V_U$.

The constant current charging event is a procedure of charging the battery B with the charge current of a predetermined current rate (for example, 0.1 C-rate) for a constant current period from the time at which the battery voltage reaches the lower limit $V_L$ of the set voltage range to the time at which the battery voltage reaches the upper limit $V_U$. The upper limit $V_U$ (for example, 4.3 V) is equal to the end-of-charge voltage $V_C$. The lower limit $V_L$ may be equal to a voltage (for example, 4.0 V) that is lower than the upper limit $V_U$ by a reference voltage $V_{ref}$ (for example, 0.3 V). That is, the width of the set voltage range is equal to the reference voltage $V_{ref}$.

The differential capacity dQ/dV is a ratio of a change dV in the charge capacity Q for each unit time to a change dQ in the battery voltage V for each unit time. In an example, the control circuit 230 may determine an approximate capacity curve that is the result of fitting the relationship between the battery voltage and the charge capacity of the capacity curve 201 of FIG. 2 to a polynomial function through curve fitting. As the capacity curve 201 is converted to the approximate capacity curve, the noise component present in the capacity curve 201 is removed. Subsequently, the control circuit 230 may obtain the differential curve 301 as a result of differentiating the approximate capacity curve of the capacity curve 201 with respect to the battery voltage which is the input variable. Likewise, the control circuit 230 may obtain the differential curve 302 as a result of differentiating the approximate capacity curve of the capacity curve 202 with respect to the battery voltage.

In the sample battery in which lithium deposition is present, some of lithium ions having moved to the negative electrode are not intercalated into the negative electrode and are deposited as metal lithium on the negative electrode surface during charging. Accordingly, to increase the sample battery in which lithium deposition is present and the sample battery free of lithium deposition to the same battery voltage, an additional charge current as much as an amount of lithium ions deposited as metal lithium is required. Referring to FIG. 3, in the set voltage range, as the battery voltage rises from the lower limit $V_L$ to the upper limit $V_U$, the differential capacity of the differential curve 301 gradually decreases approximately linearly. In contrast, it is observed that the differential curve 302 has a nonlinear increase in differential capacity in some of the set voltage range due to lithium deposition.

Hereinafter, it is assumed that the capacity curve and the differential curve of the battery B are the same as the capacity curve 202 and the differential curve 302, respectively.

The control circuit 230 determines an approximate straight line 312 of the differential curve 302 using a linear approximation algorithm. The linear approximation algorithm is a type of curve fitting, and is a method that converts a curve to a straight line having a single slope. In an example, the least square method may be used for the linear approximation algorithm. The approximate straight line 312 may be expressed as the following Equation 1.

$$y_a(x) = Ax + B \qquad \langle \text{Equation 1} \rangle$$

In the above Equation 1, x is the battery voltage, A is the slope of the approximate straight line 312, B is a y-intercept of the approximate straight line 312, and $y_a(x)$ is an approximate value of the differential capacity when the battery voltage is equal to x.

The reference voltage $V_{ref}$ may be given, taking the electrochemical specification of the battery B into account. Alternatively, the control circuit 230 may determine the reference voltage $V_{ref}$ based on a cumulative usage capacity of the battery B. The cumulative usage capacity may be a cumulative value of the discharge current or a cumulative value of the charge current flowing through the battery B or the sum of them for the total usage period from the release of the battery B to the start time of the constant current charging period. The memory device may pre-record a lookup table defining a predetermined correlation between the cumulative usage capacity and the reference voltage $V_{ref}$. In the lookup table, the reference voltage $V_{ref}$ may have a linear or nonlinear inversely proportional relation to the cumulative usage capacity. That is, in the lookup table, the larger cumulative usage capacity may be associated with the smaller reference voltage. As the battery B degrades, lithium deposition gets severe, and thus when the reference voltage $V_{ref}$ decreases with the increasing cumulative usage capacity of the battery B, it is possible to reduce the amount of computation necessary to determine the approximate straight line 312.

In an embodiment, when the slope A of the approximate straight line 312 is larger than a reference slope, the control circuit 230 may determine that lithium deposition is present in the battery B. The reference slope may be given, taking the electrochemical specification of the battery B into account. Alternatively, the control circuit 230 may determine the reference slope based on the cumulative usage capacity of the battery B. The memory device may pre-record a lookup table defining a predetermined correlation between the cumulative usage capacity and the reference slope. In the lookup table, the reference slope may have a linear or nonlinear proportional relation to the cumulative usage capacity. That is, in the lookup table, the larger cumulative usage capacity may be associated with the larger reference slope. As the battery B degrades, lithium deposition gets severe, and thus when the reference slope increases with the increasing cumulative usage capacity of the battery B, it is possible to effectively diagnose lithium deposition according to the degree of degradation of the battery B.

In another embodiment, the control circuit 230 may calculate a coefficient of determination of the approximate straight line 312 of the differential curve 302, and when the coefficient of determination is less than a reference coefficient of determination, determine that lithium deposition is present in the battery B. In general, the coefficient of determination is a value between 0 and 1 indicated as $R^2$, and in the specification, it indicates the descriptive power of the approximate straight line 312 of the differential curve 302. The control circuit 230 may calculate the coefficient of determination between the approximate straight line 312 and the differential curve 302 using the following Equation 2.

$$R^2 = \frac{\sum_{i=1}^{n} \{y_a(x_i) - y_{av}\}^2}{\sum_{i=1}^{n} \{y_m(x_i) - y_{av}\}^2} \qquad \langle \text{Equation 2} \rangle$$

In Equation 2, $y_{av}$ is the average differential capacity of the differential curve 302 in the set voltage range, $y_m(x_i)$ is the differential capacity of the differential curve 302 when the battery voltage is equal to $x_i$, $y_a(x_i)$ is the differential capacity of the approximate straight line 312 when the battery voltage is equal to $x_i$, and $R^2$ is the coefficient of determination of the approximate straight line 312 of the differential curve 302.

As lithium deposition in the battery B gets severer, nonlinearity of the differential curve 302 increases, and as the nonlinearity of the differential curve 302 increases, the coefficient of determination between the approximate straight line 312 and the differential curve 302 reduces down to 0.

The reference coefficient of determination may be given, taking the electrochemical specification of the battery B into account. Alternatively, the control circuit 230 may calculate the reference coefficient of determination based on the cumulative usage capacity of the battery B. The memory device may pre-record a lookup table defining a predetermined correlation between the cumulative usage capacity and the reference coefficient of determination. In the lookup table, the reference coefficient of determination may have a linear or nonlinear proportional relation to the cumulative usage capacity. That is, in the lookup table, the larger cumulative usage capacity may be associated with the larger reference coefficient of determination. As the battery B degrades, lithium deposition gets severe, and thus when the reference coefficient of determination increases with the increasing cumulative usage capacity of the battery B, it is possible to effectively diagnose lithium deposition according to the degree of degradation of the battery B.

When lithium deposition in the battery B is determined, the control circuit 230 may perform a predetermined safety function. In an example, the control circuit 230 may transmit a warning message to the vehicle controller 6 through the communication circuit 320. In another example, the control circuit 230 may reduce the maximum allowable value of the charge current and/or the discharge current. The reduction in the maximum allowable value may be proportional to a difference between the slope of the approximate straight line 312 and the reference slope and/or a difference between the coefficient of determination of the approximate straight line 312 and the differential curve 302 and the reference coefficient of determination.

Figure 4:
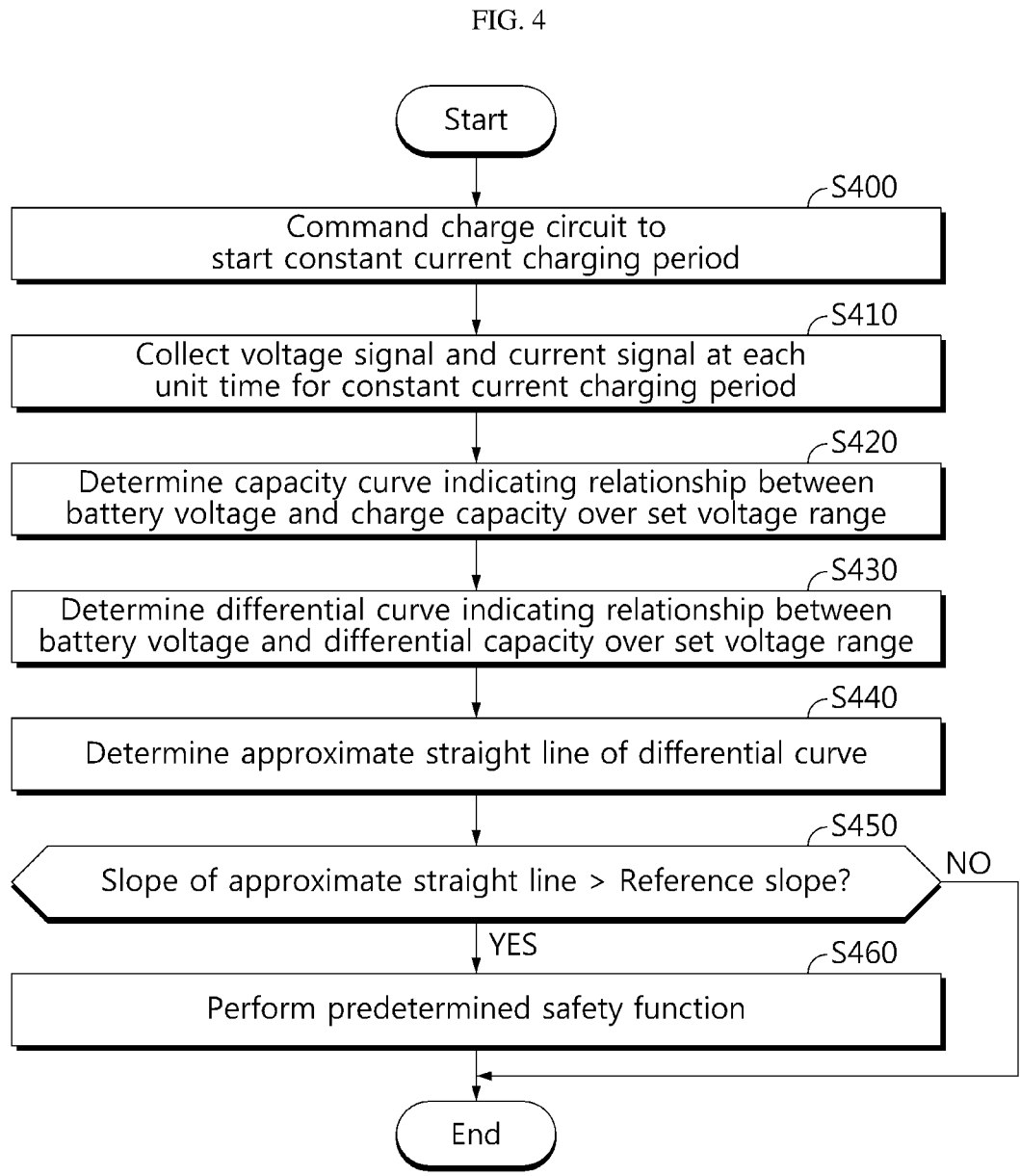
FIG. 4 is an exemplary flowchart showing a battery diagnosis method according to a first embodiment of the present disclosure.

FIG. 4 is an exemplary flowchart showing a battery diagnosis method according to a first embodiment of the present disclosure. The method of FIG. 4 may be performed by the battery diagnosis apparatus 200.

Referring to FIGS. 1 to 4, in step S400, the control circuit 230 commands the charge module 5 to start the constant current charging period. The constant current charging period is a period of time during which the battery B is charged at the predetermined current rate over the set voltage range $V_L$~$V_U$.

In step S410, the control circuit 230 collects the voltage signal and the current signal at each unit time for the constant current charging period. That is, the control circuit 230 generates a time series of the battery voltage and a time series of the battery current over the constant current charging period.

In step S420, the control circuit 230 determines the capacity curve 202 indicating the relationship between the battery voltage and the charge capacity over the set voltage range $V_L$~$V_U$ based on the voltage signal and the current signal collected for the constant current charging period.

In step S430, the control circuit 230 determines the differential curve 301 indicating the relationship between the battery voltage and the differential capacity over the set voltage range $V_L$~$V_U$ based on the capacity curve 202. The differential capacity is a ratio dQ/dV of a change in the charge capacity for each unit time to a change in the battery voltage for each unit time.

In step S440, the control circuit 230 determines the approximate straight line 312 of the differential curve 302 using the predetermined linear approximation algorithm.

In step S450, the control circuit 230 determines whether the slope of the approximate straight line 312 is larger than the reference slope. The approximate straight line 312 having a larger slope than the reference slope indicates that lithium deposition is present in the battery B. When a value of the step S450 is "YES", step S460 may be performed.

In the step S460, the control circuit 230 performs the predetermined safety function.

Figure 5:
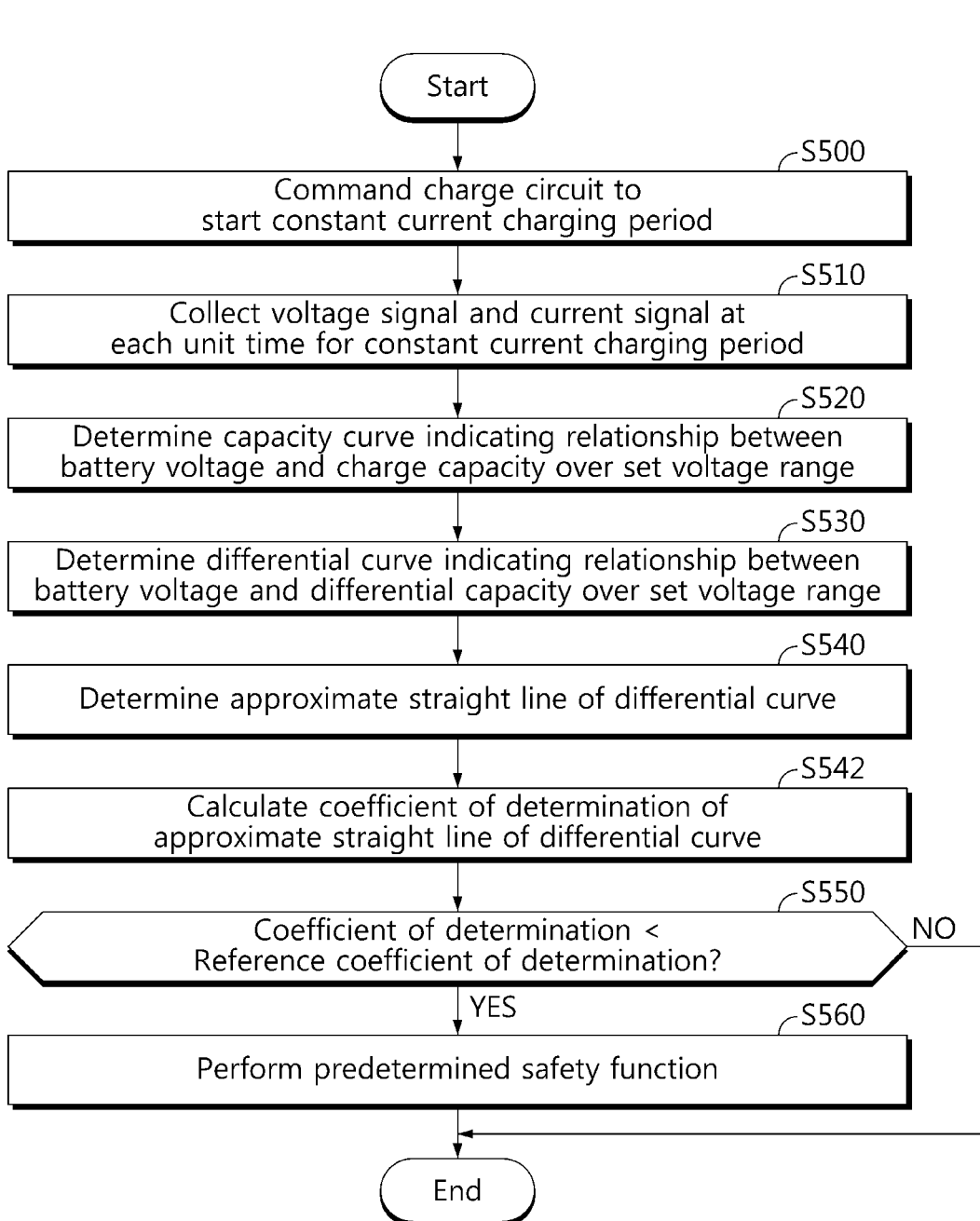
FIG. 5 is an exemplary flowchart showing a battery diagnosis method according to a second embodiment of the present disclosure.

FIG. 5 is an exemplary flowchart showing a battery diagnosis method according to a second embodiment of the present disclosure. The method of FIG. 5 may be performed by the battery diagnosis apparatus 200.

Referring to FIGS. 1 to 3 and 5, in step S500, the control circuit 230 commands the charge module 5 to start the constant current charging period. The constant current charging period is a period of time during which the battery B is charged at the predetermined current rate over the set voltage range $V_L$~$V_U$.

In step S510, the control circuit 230 collects the voltage signal and the current signal at each unit time for the constant current charging period. That is, the control circuit 230 generates a time series of the battery voltage and a time series of the battery current over the constant current charging period.

In step S520, the control circuit 230 determines the capacity curve 202 indicating the relationship between the battery voltage and the charge capacity over the set voltage range $V_L$~$V_U$ based on the voltage signal and the current signal collected for the constant current charging period.

In step S530, the control circuit 230 determines the differential curve 301 indicating the relationship between the battery voltage and the differential capacity over the set voltage range $V_L$~$V_U$ based on the capacity curve 202. The differential capacity is a ratio dQ/dV of a change in the charge capacity for each unit time to a change in the battery voltage for each unit time.

In step S540, the control circuit 230 determines the approximate straight line 312 of the differential curve 302 using the predetermined linear approximation algorithm.

In step S542, the control circuit 230 calculates the coefficient of determination of the approximate straight line 312 of the differential curve 302.

In step S550, the control circuit 230 determines whether the determined coefficient of determination is smaller than the reference coefficient of determination. The coefficient of determination between the differential curve 302 and the approximate straight line 312 smaller than the reference coefficient of determination indicates that lithium deposition is present in the battery B. When a value of the step S550 is "YES", step S560 may be performed.

In the step S560, the control circuit 230 performs the predetermined safety function.

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

DESCRIPTION OF REFERENCE NUMERALS

1: Electric vehicle
2: Battery pack
B: Battery

100: Battery management system
200: Battery diagnosis apparatus
210: Voltage sensor
220: Current sensor
230: Control circuit

What is claimed is:

1. A battery diagnosis apparatus, comprising:

a voltage sensor configured to measure a battery voltage across a battery and generate a voltage signal indicating the measured battery voltage;

a current sensor configured to measure a battery current flowing through the battery and generate a current signal indicating the measured battery current; and a control circuit configured to:

collect the voltage signal and the current signal at each unit time;

determine a capacity curve indicating a relationship between the battery voltage and a charge capacity over a predetermined set voltage range based on the voltage signal and the current signal collected at each unit time for a constant current charging period of the battery over the set voltage range, wherein the charge capacity indicates a cumulative value of the battery current;

determine a differential curve indicating a relationship between the battery voltage and a differential capacity over the set voltage range based on the capacity curve, wherein the differential capacity is a ratio between a change in the charge capacity for each unit time and a change in the battery voltage for each unit time;

determine a linear approximation of the differential curve using a linear approximation algorithm;

determine whether lithium deposition is present in the battery based on the linear approximation; and reduce a maximum allowable value of at least one of a charge current or a discharge current of the battery in response to the lithium deposition being present in the battery.

2. The battery diagnosis apparatus according to claim 1, wherein an upper limit of the set voltage range is equal to a preset end-of-charge voltage for the battery, and a lower limit of the set voltage range is lower than the upper limit by a reference voltage amount.

3. The battery diagnosis apparatus according to claim 1, wherein the linear approximation algorithm is a least square method.

4. The battery diagnosis apparatus according to claim 1, wherein the control circuit is configured to determine that lithium deposition is present in the battery in response to a slope of the linear approximation being larger than a reference slope.

5. The battery diagnosis apparatus according to claim 4, wherein the control circuit is configured to determine the reference slope based on a cumulative usage capacity of the battery.

6. The battery diagnosis apparatus according to claim 1, wherein the control circuit is configured to determine that lithium deposition is present in the battery in response to a coefficient of determination of the linear approximation of the differential curve is smaller than a reference coefficient of determination.

7. The battery diagnosis apparatus according to claim 6, wherein the control circuit is configured to determine the reference coefficient of determination based on a cumulative usage capacity of the battery.

8. A battery pack comprising the battery diagnosis apparatus according to any claim 1.

9. An electric vehicle comprising the battery pack according to claim 8.

10. A battery diagnosis method comprising:

determining, by a control circuit, a capacity curve indicating a relationship between (i) a battery voltage measured across a battery and (ii) a charge capacity over a predetermined set voltage range based on a voltage signal and a current signal collected at each unit time for a constant current charging period of the battery over the predetermined set voltage range;

determining, by the control circuit, a differential curve indicating a relationship between the battery voltage and a differential capacity over the set voltage range based on the capacity curve, wherein the differential capacity is a ratio between a change in the charge capacity for each unit time and a change in the battery voltage for each unit time;

determining, by the control circuit, a linear approximation of the differential curve using a linear approximation algorithm;

determining, by the control circuit, whether lithium deposition is present in the battery based on the linear approximation; and reducing, by the control circuit, a maximum allowable value of at least one of a charge current or a discharge current of the battery in response to the lithium deposition being present in the battery.

* * * * *